(12) United States Patent
Ewing et al.

(10) Patent No.: US 7,268,998 B2
(45) Date of Patent: Sep. 11, 2007

(54) GANGED OUTLET POWER DISTRIBUTION APPARATUS

(75) Inventors: Carrel W. Ewing, Reno, NV (US); Andrew J. Cleveland, Reno, NV (US); James P. Maskaly, Sparks, NV (US); Dennis W. McGlumphy, Sun Valley, NV (US); Nathan Moll, Reno, NV (US)

(73) Assignee: Server Technology, Inc., Reno, NV (US)

( * ) Notice: Subject to any disclaimer, the term of this patent is extended or adjusted under 35 U.S.C. 154(b) by 90 days.

(21) Appl. No.: 11/265,675

(22) Filed: Nov. 1, 2005

(65) Prior Publication Data

US 2006/0139855 A1    Jun. 29, 2006

Related U.S. Application Data

(60) Provisional application No. 60/624,286, filed on Nov. 1, 2004.

(51) Int. Cl.
H02B 1/26 (2006.01)
H01R 13/46 (2006.01)

(52) U.S. Cl. ............... 361/622; 361/624; 361/626; 174/59

(58) Field of Classification Search ........... 361/601, 361/622, 624, 626, 642, 648; 174/59; 312/223.2, 312/223, 3; 439/107, 373, 535, 620
See application file for complete search history.

(56) References Cited

U.S. PATENT DOCUMENTS

| | | | |
|---|---|---|---|
| 4,840,568 A | | 6/1989 | Burroughs et al. |
| 4,952,164 A | * | 8/1990 | Weber et al. ............ 439/215 |
| 5,046,963 A | * | 9/1991 | Kelly ..................... 439/211 |
| 5,092,786 A | * | 3/1992 | Juhlin et al. ............ 439/215 |
| 5,203,713 A | * | 4/1993 | French et al. ........... 439/215 |
| 5,506,573 A | | 4/1996 | Ewing et al. |
| 5,680,294 A | | 10/1997 | Stora et al. |
| 5,821,636 A | | 10/1998 | Baker et al. |
| 5,949,947 A | | 9/1999 | Eslambolchi et al. |
| 6,220,880 B1 | | 4/2001 | Lee et al. |
| 6,229,691 B1 | * | 5/2001 | Tanzer et al. ............ 361/622 |
| 6,380,862 B1 | | 4/2002 | Karim et al. |
| 6,443,746 B1 | | 9/2002 | Yu |
| 6,626,705 B2 | | 9/2003 | Perrone et al. |
| 6,663,435 B2 | * | 12/2003 | Lincoln et al. .......... 439/652 |
| 6,667,681 B1 | | 12/2003 | Meiners et al. |
| 6,711,613 B1 | | 3/2004 | Ewing et al. |

(Continued)

Primary Examiner—Jayprakash Gandhi
Assistant Examiner—Robert J. Hoffberg
(74) Attorney, Agent, or Firm—Klarquist Sparkman, LLP

(57) ABSTRACT

A power distribution unit is provided that may be used to distribute power to a plurality of electronic devices. The power distribution unit may have one or more outlet gangs with integral components providing a plurality of individual power outlets. Each outlet gang may be associated with one or more power rails which deliver power to each power outlet. A connector may be located on each power rail. The power distribution unit may include a connector board for connection to two or more electronic components, such as outlet gangs. Fuse access windows may be provided to provide access to a fuse holder. The power distribution unit may have a housing having a mounting channel formed therein, which may allow the power distribution unit to be mounted in relatively to a rack having a protrusion which may be received by the mounting channel.

37 Claims, 11 Drawing Sheets

U.S. PATENT DOCUMENTS

| | | |
|---|---|---|
| 6,741,442 B1 * | 5/2004 | McNally et al. ............ 361/166 |
| 6,826,036 B2 | 11/2004 | Pereira |
| 6,827,582 B2 | 12/2004 | Morris et al. |
| 6,862,187 B2 * | 3/2005 | Robbins et al. ............ 361/725 |
| 6,882,530 B2 | 4/2005 | Cyphers et al. |
| 6,897,379 B1 | 5/2005 | Hsiao |
| 6,940,730 B1 | 9/2005 | Berg et al. |
| 6,967,283 B2 | 11/2005 | Rasmussen et al. |
| 7,043,543 B2 * | 5/2006 | Ewing et al. ............... 709/223 |
| 7,116,550 B2 * | 10/2006 | Ewing et al. ................ 361/623 |
| 7,141,891 B2 * | 11/2006 | McNally et al. ............. 307/39 |
| 7,173,821 B2 * | 2/2007 | Coglitore .................... 361/695 |
| 2002/0052940 A1 * | 5/2002 | Myers et al. ................ 709/223 |
| 2004/0189161 A1 * | 9/2004 | Davis et al. ............. 312/265.3 |
| 2005/0094357 A1 | 5/2005 | Ewing et al. |
| 2005/0101193 A1 * | 5/2005 | Godard ...................... 439/652 |
| 2005/0259383 A1 | 11/2005 | Ewing et al. |

\* cited by examiner

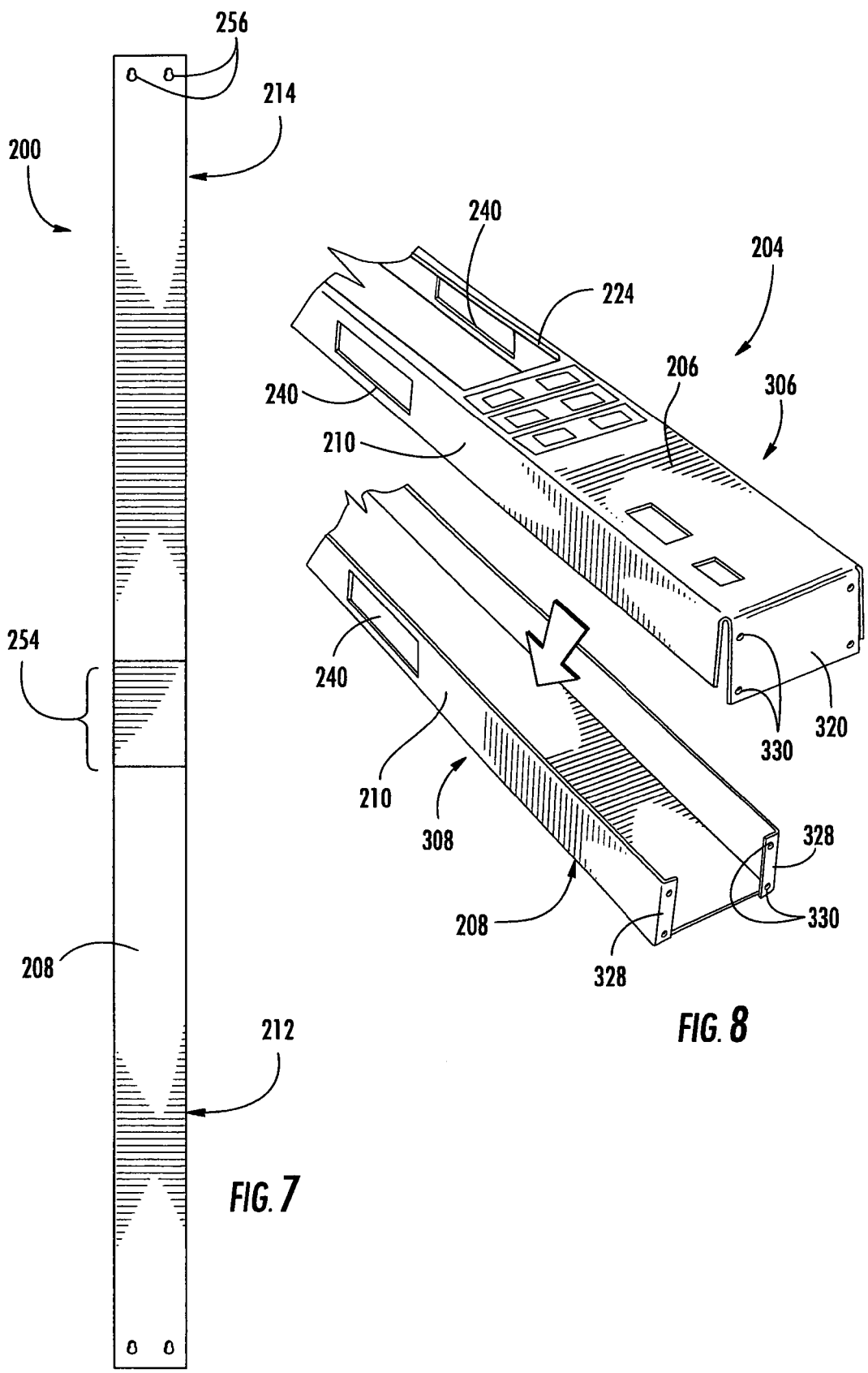

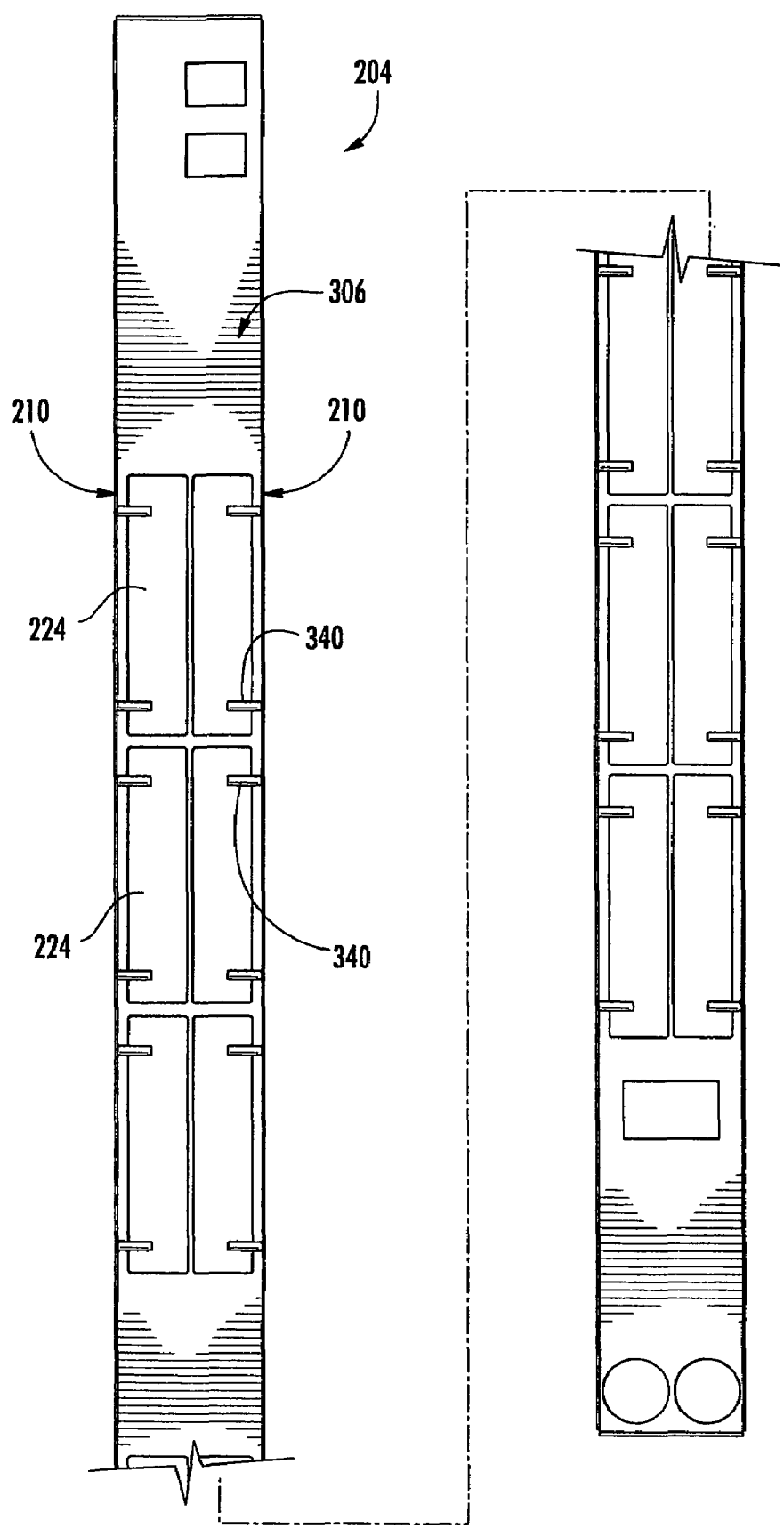

GANGED OUTLET POWER DISTRIBUTION APPARATUS

CROSS REFERENCE TO RELATED APPLICATION

This application claims priority through, and incorporates by reference, the applicants' provisional patent application, Ser. No. 60/624,286, filed Nov. 1, 2004, entitled Power Distribution Apparatus.

BACKGROUND OF THE INVENTION

1. Field of the Invention

The present invention relates to power distribution apparatus. More particularly, the present invention relates to power distribution apparatus having ganged power outlets.

2. Description of the Related Art

Electronic equipment racks commonly consist of rectangular or box-shaped housings or rack structures. Electronic equipment is commonly mountable in such racks so that the various electronic components are aligned vertically one on top of the other in the rack. Often, multiple racks are oriented side-by-side, with each rack containing numerous electronic components and having substantial quantities of associated component wiring located both within and outside of the area occupied by the racks.

Power distribution units have long been utilized to supply power to the equipment in such racks. Power distribution units have also been designed to allow a user to remotely monitor and control the power distribution unit or devices attached to the power distribution unit. Examples of such power distribution units can be found in U.S. Pat. Nos. 5,506,573, 5,949,947, and 6,711,613.

One particularly common such power distribution unit consists of an elongated box housing that has one or more power inputs and a number of power outputs extending along the longitudinal face of the unit. This power distribution unit is designed to mount vertically adjacent or secured to the external rear side of the rack. In this fashion, the power supplied to the unit is then distributed through horizontally extending power outputs to the, typically, horizontally co-aligned electronic components mounted in the rack.

An example of such a prior power distribution unit is shown in FIG. 1 and is sold under the trademark Sentry POWER TOWER by Server Technology, Inc., of Reno, Nev. FIG. 1 shows this prior art Sentry POWER TOWER power distribution unit secured to the outer edge of a generally rectangular rack to supply power to electronic components mounted within the rack.

In addition to being mountable on the outside of a rack, certain power distribution units may be mounted on the inside of a rack, such as a RETMA rack for example. The design of the rack may limit how closely a power distribution unit may be mounted to frame of the rack itself. For example, certain housings, such as that shown in FIG. 2, have support braces or other features that limit how closely the power distribution unit can be placed to the side of the rack. If the power distribution unit is to be mounted more closely to the rack, multiple smaller power distribution units must typically be used in order to avoid a power distribution unit abutting the support brace or protrusion.

As previously stated, each power distribution unit typically contains a number of power outputs and at least one power input. The power distribution units may also contain other electronic components, such as fuses and monitoring devices. Typically, all of these electronic components must be wired together, which can create numerous problems and inefficiencies.

One such problem is that the size of the electronic components and the associated wiring may limit the dimensions and shape of the housing. A housing having a certain minimum size usually is required merely to hold the electronic components and wiring of the power distribution unit. The size of the housing can limit the location in which the power distribution unit can be mounted. For example, the power distribution unit may be too large for certain spaces. The size of the components and wiring may limit how many and what kind of components can be included in a power distribution unit. The housing typically must be sized such that the various electrical components do not make undesired contact with each other.

Such prior art power distribution units often require substantial time and effort to assemble because each electronic component is typically individually mounted in the housing. Furthermore, each electronic component is typically individually wired. The cost to build such devices may be influenced by material costs that are partially determined by factors such as the size of the housing, the amount of wiring in each device, and the amount of other materials, such as solder, needed to assemble each power distribution unit. In addition to possibly requiring greater assembly time, the numerous parts and connections in typical prior art power distribution units may result in a greater number of errors during the manufacturing process or a greater chance of equipment failure once the power distribution units are in use.

Some prior art power distribution units are protected by fuses or other devices to protect the power distribution unit and attached electronic devices against over-voltage conditions. Often, the fuses may only be checked and replaced by removing the power distribution unit from a rack and opening up the power distribution unit. In addition to possibly being time consuming and labor intensive, opening up the unit may violate a warranty on the unit.

SUMMARY OF THE INVENTION

In certain embodiments, the present invention provides a power distribution unit constructed using an outlet gang. In further embodiments, a power distribution unit is constructed using two such outlet gangs.

In at least some embodiments, an outlet gang is a single electrical component having a plurality of electrical outlets. At least one power rail is coupled to the outlet gang. The power rail may be connected to each power outlet in the outlet gang in order to deliver power, such as AC line power, to each power outlet. The power rail may have a connector at least at one end. In certain embodiments, the power rail has connectors at two ends.

The above embodiments may provide a number of advantages. For example, the size of a power distribution unit may be reduced because each outlet no longer needs to be connected by standard, flexible wires. Because of the reduced number of parts, these embodiments may provide other advantages, such as faster assembly, fewer assembly errors, and enhanced reliability. One or more of these advantages may reduce the cost of manufacturing the power distribution units.

In addition, the potential compactness of these embodiments may allow additional electronic components to be added to the power distribution unit without significantly increasing the size of the housing. Also, the modular nature of the outlet gangs may allow easier repair or replacement of components of the power distribution unit.

In certain embodiments, the present invention can include an electrical connector, which may be a power connection board. In further embodiments, the power connection board has connection points at least at two electrical connection areas. A first electrical component may be coupled to the first electrical connection area of the power connection board. In at least one embodiment, the first electrical component is an outlet gang. At least one power rail is coupled to the outlet gang in order to distribute power, such as AC line power, to a plurality of electrical outlets in the outlet gang. In further embodiments, a second electrical component is coupled to the second area of the power connection board. The second electrical component may be an outlet gang having a power rail that may deliver power to a plurality of electrical outlets of the outlet gang.

The power connection board can provide a compact way to transmit electrical signals to, or electrically connect, at least two electrical components. For example, The power connection board may be used to transfer AC line power to attached electronic components. In additional embodiments, the power connection board may also carry electrical signals which may represent data. The use of a power connection board can reduce the amount of wiring needed in a power distribution apparatus.

Accordingly, these and other embodiments or aspects of the present invention or embodiments disclosed herein may variously increase the speed at which power distribution units may be manufactured, reduce the number of assembly errors, enhance the reliability of the power distribution units, allow the power distribution units to be more easily repaired, increase the number of power outlets per unit area or volume in a power distribution unit, and/or reduce the size of the power distribution units.

In certain embodiments, the connection board is a printed circuit board having a plurality of layers. One or more layers of the printed circuit board may transmit a particular electrical component. For example, in AC line power transmission, one layer may correspond to an AC line connection and another layer may correspond to an AC neutral connection. Other layers could be used for a ground connection or to transmit other electrical signals, including communication signals. Using an entire layer of a circuit board to transmit an electrical component may allow a larger amount of the electrical component, such as a component of AC line power, to be transmitted using the circuit board. The relatively large transmission capacity of the layers of the circuit board may allow the circuit board to function as an assembly of wires.

In other embodiments, the power connection board comprises at least one layer formed in a plurality of sublayers. An insulating barrier may separate each sublayer. Accordingly, each sublayer may be used to transmit a different electrical component, such as a component of AC line power or data. The use of a power connection board having a layer formed in a plurality of sublayers may allow the power connection board to have fewer layers, to transmit more electrical components, and/or be attached to a greater number of electrical parts. The size of the sublayer is sufficiently large to allow effective transmission of the particular electric component.

The power connection board may allow connections to be made in varying configurations. For example, certain embodiments of the invention may provide two electrical parts in a back to back configuration, with the circuit board intermediate the electrical parts. If standard wires were used, the wires would need to cross in order to properly connect the components. The crossed wires may make the assembly of the power distribution unit more complex and may require more space in the housing. Using the circuit board, this configuration (the crossing of the connection) can be made internal, requiring no modification of the housing or in how the power distribution units are assembled.

Other embodiments are directed to a power distribution unit having a housing. The housing may have a mounting channel (or notch). The mounting channel may be formed in a side, typically the rear side, of the power distribution unit and may allow the power distribution unit to be mounted more closely to the side of a rack having a protrusion. The mounting channel is adapted to fit over the protrusion when the power distribution unit is secured to the rack. At least one electrical connector, such as a power connection board, can be disposed substantially within the section of housing forming the channel. A first electrical component may be connected to a first electrical connection area of the connection board. A second electrical component may be connected to a second electrical connection area of the connection board. In certain embodiments, the second electrical connection area is at an opposite end of the connection board from the first electrical connection area.

These embodiments may allow a power distribution unit to be mounted more closely to a side of a rack, thereby occupying less of the interior of the rack and allowing more room for electrical components and associated wiring. For example, as discussed above, some racks utilize support bars on the side of the rack, or otherwise have protrusions that typically limit how closely prior art power distribution units can be placed to the rack. Because the mounting channel fits over the protrusion, the power distribution unit may be mounted more closely to a side of the rack, reducing the amount of interior space taken up by the power distribution unit.

Further embodiments are directed to an assembly of electrical components, at least one component being an outlet gang. The outlet gang has a plurality of electrical outlets. At least one power rail is coupled to the outlet gang. A sheet of nonconducting material is placed on the side of the power rail opposite the outlet gang. An electronic component is mounted adjacent the other side of the nonconducting material. In at least one embodiment, the electrical component is a fuse holder. The presence of the nonconducting material may allow electrical components to be placed in close proximity to the outlet gang.

In additional embodiments, the power distribution unit may have access openings. The access opening may allow access to, or visual inspection of, certain components of the power distribution unit, such as fuses. Further embodiments provide a separate component, such as a light source, which indicates the status of a fuse or similar device. In this way, an operator may visually determine whether a fuse has blown without having to remove or disassemble the power distribution unit. In addition, in certain embodiments, the operator may replace the fuse without having to remove or disassemble the power distribution unit. In at least one embodiment, the power distribution unit is constructed so that an access opening may be provided on a selected side of the power distribution unit during assembly. In additional embodiments, the access openings may be covered, including by transparent windows or by protective coverings such as metal or plastic plates.

It is to be understood that this Summary of the Invention lists various aspects of the present invention or various embodiments. Additional aspects will become apparent as this specification proceeds.

It is also to be understood that all features noted above need not be included in a given embodiment in order for the embodiment to fall within the scope of the present invention. In addition, not all deficiencies noted in the prior art need be overcome by a given embodiment in order for it to fall within the scope of the present invention.

BRIEF DESCRIPTION OF THE DRAWINGS

The preferred embodiments of the present invention are shown in the accompanying drawings in which:

FIG. 5 is a side plan view of the power distribution apparatus of FIG. 3.

FIG. 6 is a plan view of the other side of the power distribution apparatus of FIG. 3.

FIG. 7 is a bottom plan view of the power distribution apparatus of FIG. 3.

FIG. 8 is a perspective view a portion of the housing of the power distribution apparatus of FIG. 3, illustrating how top and bottom portions of the housing may fit together.

FIG. 9 is a plan view of the inside of the top housing portion of a power distribution apparatus of the present invention.

DETAILED DESCRIPTION OF THE PREFERRED EMBODIMENTS

Figure 1:
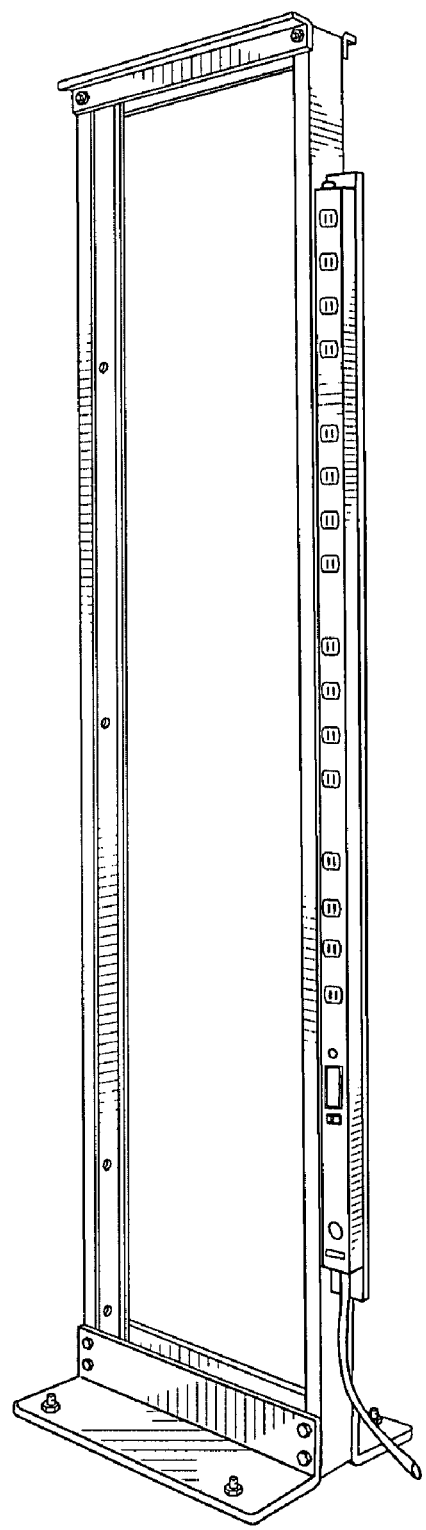
FIG. 1 is a perspective view of a prior art power distribution apparatus.
Figure 2:
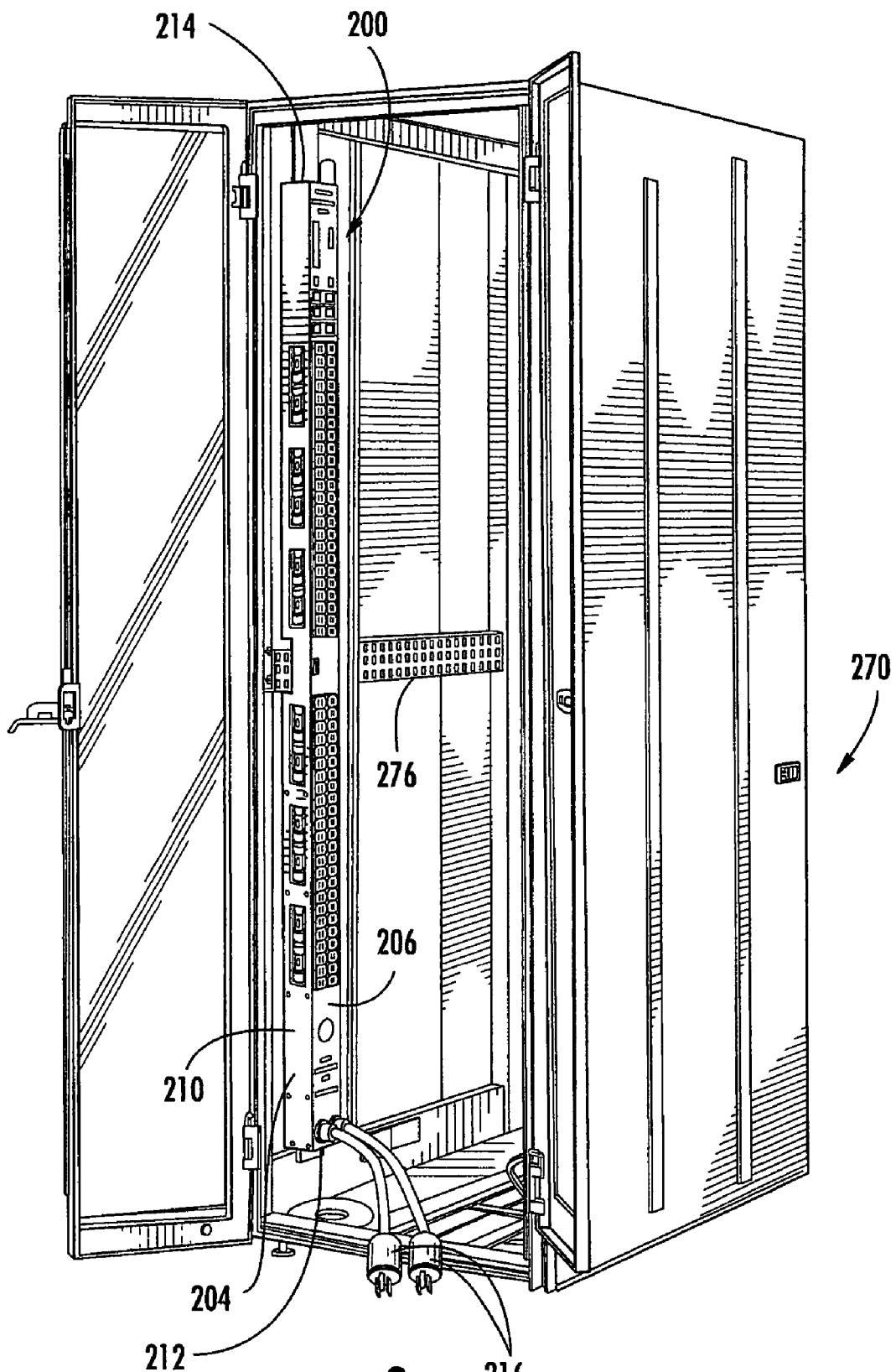
FIG. 2 is a perspective view of a power distribution apparatus of an embodiment of the present invention in use with a rack having a support brace.

The outside of a power distribution apparatus (PDA) 200 according to an embodiment of the present invention is shown in FIG. 2. The PDA 200 has a housing 204 of any suitable dimensions. The housing 204 is preferably sized for mounting in or adjacent a rack, such as, for example, the vertical RETMA electronic equipment rack 270 shown in FIG. 2. The housing 204 is shown as a rectangular box, having longitudinally extending front 206 and back faces 208 (see FIG. 7), two longitudinally extending lateral sides 210 (one of which is shown in FIG. 2), a first end 212, and a second end 214. Of course, shapes other than rectangular boxes could be used.

The housing 204 may be made of a substantially rigid and durable material, such as metals or plastics, including polycarbonate resins. In at least one embodiment, the housing 204 is made of sheet metal, such as sheet steel or other suitable shielding material.

One or more power inputs 216 may be coupled to the housing 204. In the illustrated embodiment, the power inputs are connected through the front face 206 of the housing 204, proximate the first end 212 of the housing 204. The power inputs 216 may be chosen to connect to a power supply (not shown), such as an AC line power supply, to provide a desired level of power to one or more electrical appliances (not shown). The power inputs 216 may be adapted to employ single phase power or polyphase power, such as double or triple-phase power. In embodiments employing multiphase power, multiphase power may be provided to attached electrical devices. In other embodiments, the phases are resolved and a single phase is delivered through electrical outlets to attached electrical devices.

Figure 3:
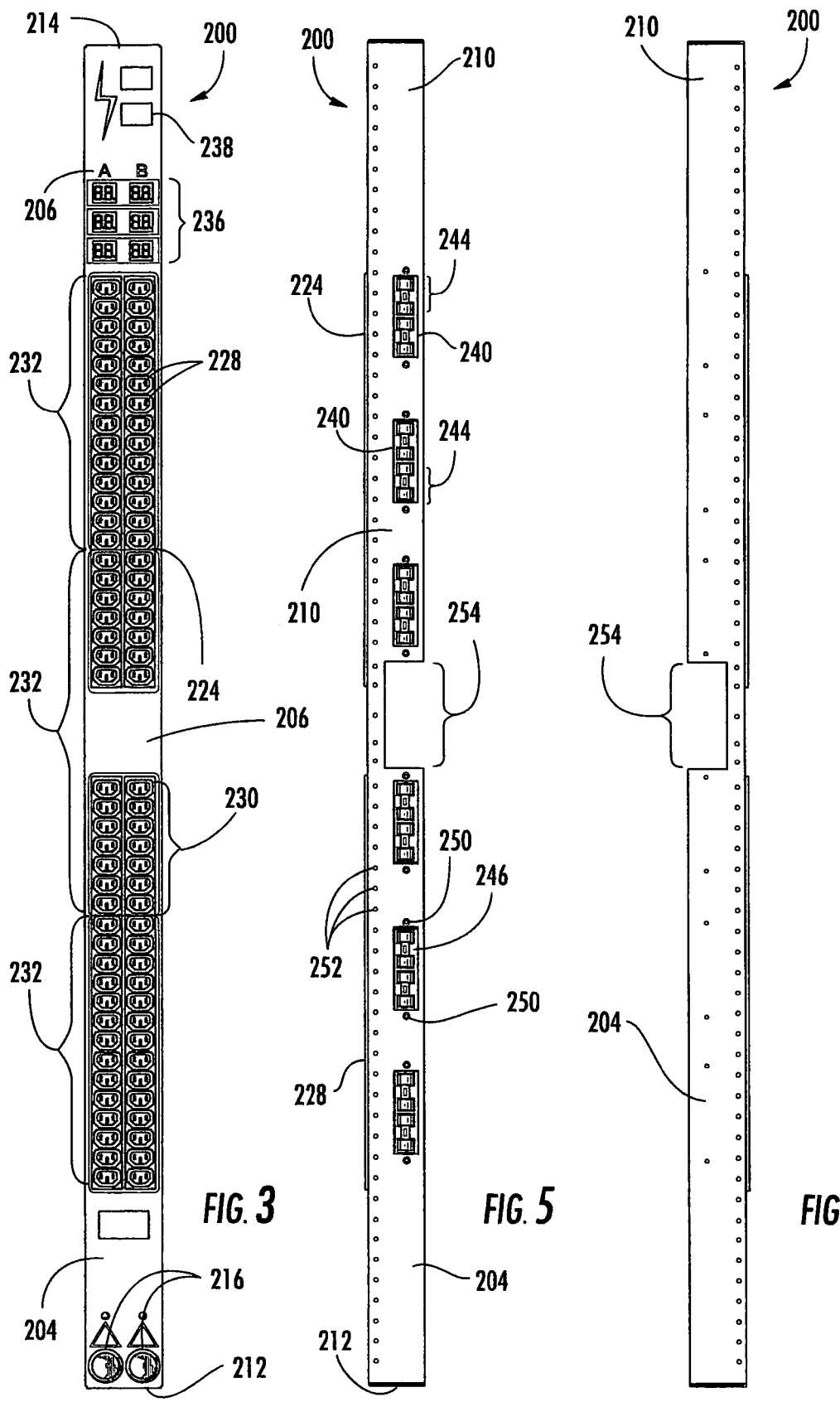
FIG. 3 is top plan view of a power distribution apparatus according to an embodiment of the present invention.

With reference now to FIG. 3, the front of the PDA 200 is shown. The housing 204 may have one or more outlet apertures 224 (see also FIG. 8) through which a plurality of power outlets 228 extend. As shown, apertures 224 are rectangular openings in the front face 206 of the housing 204. Each aperture 224, and associated power outlets 228, may represent a discrete power unit, or "branch" 232. Each branch 232 may be independently supplied with power, controlled, or wired.

In certain embodiments, including the embodiment of FIG. 3, the power outlets 228 are part of a ganged power outlet 230. The ganged power outlet 230 is a module having a plurality of electrical outlets 228. The ganged power outlets 230 may be made of integrated components providing an integral ganged outlet module. Suitable outlet gangs are type 0909 ganged outlets available from Shurter, Inc., of Santa Rosa, Calif. Ganged outlets 230 are shown as generally linear arrangements of outlets 228, which may be arranged in columns or rows. Each branch 232 may include one or more ganged outlets 230 and/or outlets 228. As shown, two ganged outlets 230 may be placed side-by-side, providing two columns of outlets 228 longitudinally extending down the front face 206 of the PDA 200.

Figure 4:
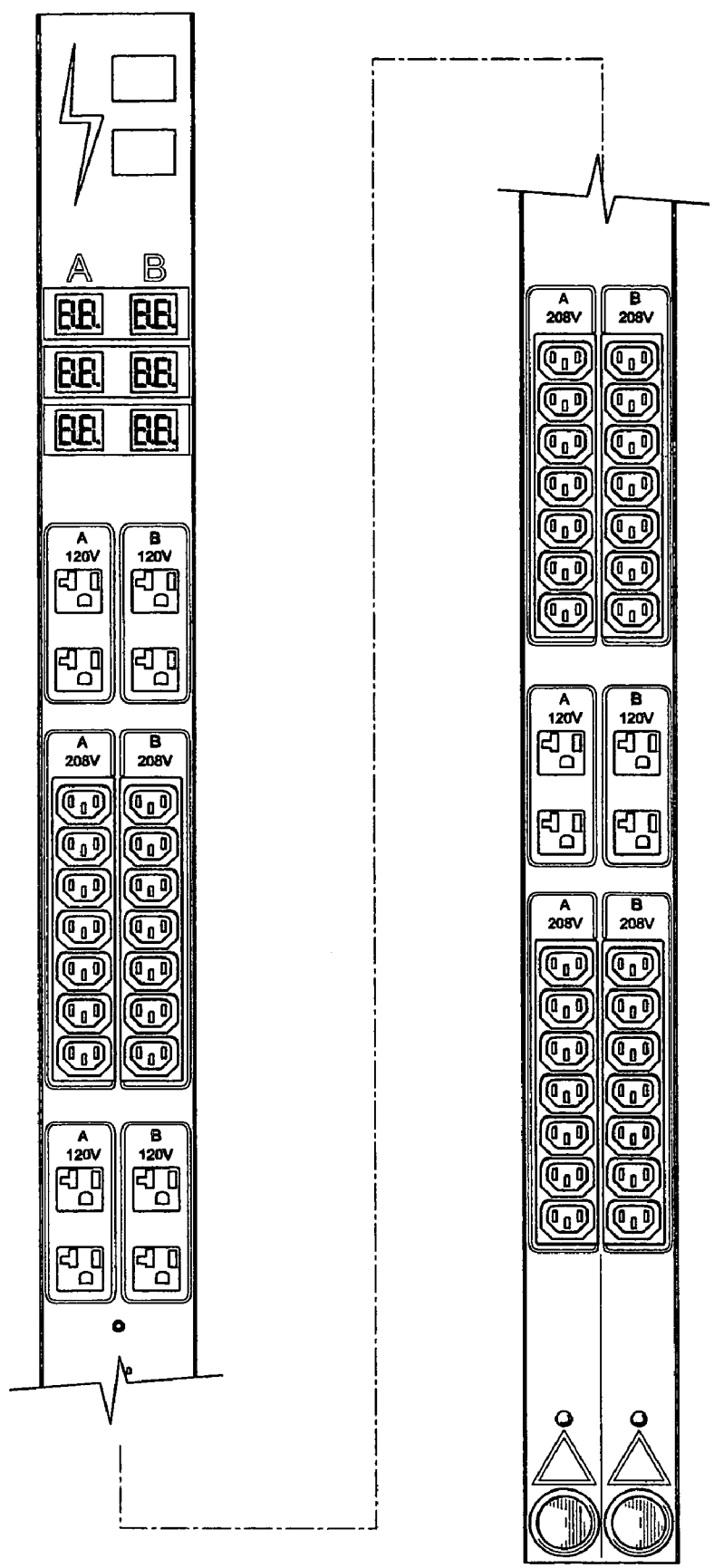
FIG. 4 is a top plan view of an alternative power distribution apparatus according to an embodiment of the present invention.

The ganged outlets 230 may be configured to deliver the same or different amounts and types of power to their corresponding power outlets 228 and their associated electronic components. For example, one ganged outlet 230 may provide 120V, 20 A power while another ganged outlet 230 may provide 240V, 50 A power. In addition, the ganged outlets 230 may have varying numbers of power outlets 228. The ganged outlets 230 may be used exclusively in the PDA 200 or in conjunction with individual outlets 228. An alternative arrangement of outlets 228, some of which may be part of outlet gangs 230, is shown in FIG. 4.

With reference again to FIG. 3, one or more displays 236 may be provided on the housing 204. As shown in FIG. 3, six displays 236 are viewable on the front face 206, proximate the second end 214, of the housing 204. The displays 236 may be LED displays, LCD displays, or any other suitable display device. The displays 236 may provide users with information on the status of the PDA 200. Such information may include the total current draw being pulled by one or more of the outlet gangs 230, the outlets 228, braches 232, or combinations thereof. For example, in the embodiment of FIG. 3, each display 236 may indicate the current drawn by one of the six branches 232. In certain embodiments, one or more displays 236 indicate whether a circuit is closed or open, such as when a fuse has blown. In additional embodiments, the displays 236 display other information, such as the ambient temperature or humidity.

The PDA 200 may also be provided with one or more communication connections 238. The communication connections 238 may be used to send information from, and provide information to, the PDA 200. For example, the communication connection 238 may be used to provide information over a network, such as the Internet, regarding the PDA 200 to a remote user. In other embodiments, a communication connection 238 may be used by service technicians to troubleshoot, program, or obtain data from the PDA 200. In additional embodiments, sensors, such as temperature and/or humidity sensors, may be attached to the communication connections 238. The communication connections 238 may be configured to accept any desired type of communication means, such as USB connections, Ethernet connection, parallel port connections, serial connections, RS232 connection, etc.

Referring now to FIG. 5, the housing 204 may have one or more access windows 240 formed in one or more sides, faces, or ends of the housing 204. In FIG. 5, a plurality of rectangular access windows 240 are shown formed in one of the lateral, perpendicularly extending sides 210 of the housing 204 at various intervals. The access windows 240 may allow convenient access to certain components of the PDA 200.

Figure 12:
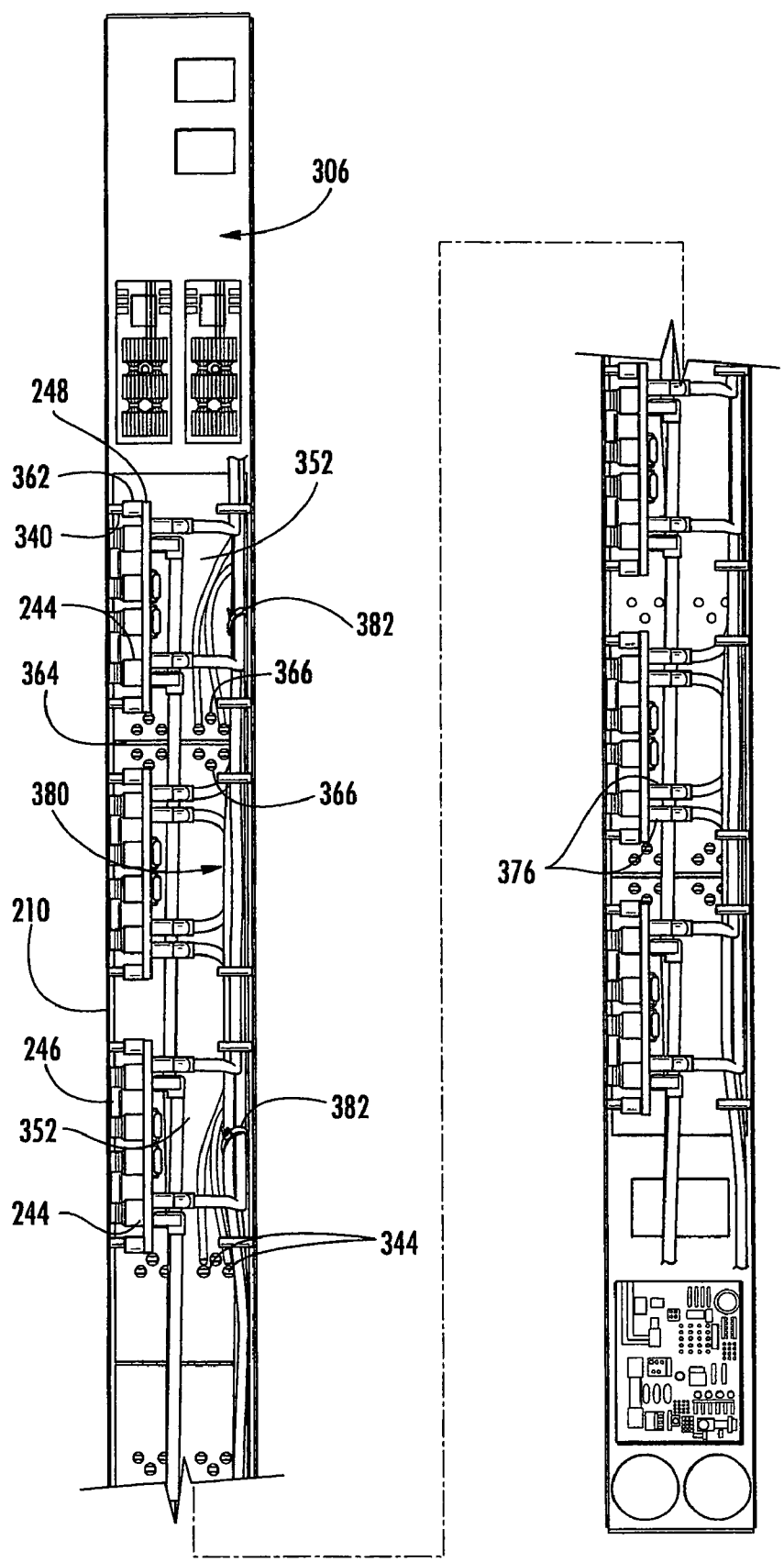
FIG. 12 is a plan view of the of the inside of the top housing portion of the power distribution apparatus of FIG. 9 illustrating the placement of wiring and fuse components on top of the components shown in FIG. 11.

For example, one or more fuse assemblies 244 may be accessible through an access opening 240. A fuse 246 may be removed from, or installed into, a fuse assembly 244. The fuse assemblies 244 may include two clamp arms that secure a removable fuse 246 and place the fuse 246 in electrical communication with a circuit of the PDA 200. Each fuse assembly 244 may include a fuse board 248 (FIG. 12). Other power interrupting devices, such as circuit breakers, may be utilized rather than the fuses 246.

The access openings 240 may be covered by a protective covering, such as a plastic or glass window (not shown). In at least one embodiment, the access openings 240 are covered with an acrylic plastic window. The access openings 240 may be located anywhere on the housing 204, and are preferably located to allow visibility of, and easy access to, the fuses 246 when the PDA 200 is in use. The fuses 246 may thereby be observed and replaced as desired without the need for removing the PDA 200 from the rack 270 (FIG. 2).

A fuse state indicator 250 may be provided to indicate the status of a fuse 246. The fuse state indicator 250 may be part of the fuse 246 or separate. For example, a fuse 246 may be provided which changes appearance when it has blown. In other embodiments, a separate fuse state indicator 250 is provided which is visible by a user. The separate fuse state indicator may be an illumination device such as an LED, is in communication with the fuse 246 and changes state if the fuse 246 blows. In one embodiment the LED 250 is normally illuminated. When a fuse 246 is blown, the LED 250 is turned off, providing a visual cue that the fuse 246 has blown.

The PDA 200 may also be provided with a plurality strain relief mounts 252. Stain relief devices (not shown), such as wire bails, may be attached to strain relief mounts 252. The strain relief devices are configured to abut power cords of devices attached to outlets 228 of PDA 200. The strain relief devices serve to organize such power cords, as well as secure them in position.

FIGS. 5 and 6 show the housing 204 with a channel 254. The channel 254 can provide a U-shaped notch in the housing 204. The channel 254 is shown located approximately in the middle of housing 204, between two outlet apertures 224. The channel 254 may be formed by cut out sections in both lateral sides 210, thereby providing a recessed section in the back face 208 (FIG. 7) of the housing 204. The channel 254 may be sized as desired to fit over a protrusion 276, such as a brace arm or similar protrusion in a rack 270 (FIG. 2).

As shown in FIG. 2, the channel 254 can allow the PDA 200 to be closely mounted to the rack 270, even if the rack 270 has reinforcement bars 276 or other protrusions. The location, shape, and size of the channel 254 may be varied as desired to accommodate a variety of racks and mounting configurations. Additionally, more than one channel 254 may be included in the housing 204.

FIG. 6 shows the lateral side 210 of the PDA 200 opposite the lateral side 210 shown in FIG. 5. As shown in FIG. 6, the lateral side 210 does not have access windows 240 formed therein. However, access windows 240 could be provided in this lateral side 210 if desired.

The back side 208 of the PDA 200 is shown in FIG. 7. If desired, additional components, such as a mounting adapter (not shown, used to mount the PDA 200 to different racks) may be formed in, or coupled to, the back side 208 of the PDA 200.

The housing 204 may have a plurality of fastener openings 256. The fastener openings 256 may be used in conjunction with a fastener (not shown), such as a nail, a bolt, a screw, a pin, etc., to secure the PDA 200 to a rack 270 (FIG. 2). As shown in FIG. 5, the fastener openings 256 are located at the ends 212, 214 of the housing 204. The fastener openings 256 may be threaded for receiving a bolt or screw (not shown) which is received by a corresponding opening in the rack 270. The number, spacing, and location of the fastener openings 256 may be varied as desired in order to enable the PDA 200 to be mounted to various types of racks. In addition, the fastener openings 256 may be provided to additional or alternate sides, faces, or ends of the housing 204 as needed.

Alternatively, the housing 204 may be provided with mounting brackets (not shown in FIG. 4) at the first 212 or second 214 ends of the PDA 200. The mounting brackets may allow the PDA 200 to be mounted in a larger number of configurations. For example, racks are made by a variety of manufacturers and may differ in size and construction. The mounting adapters may allow the PDA 200 to be used with a variety of rack types. For example, racks made by American Power Conversion, Inc. of West Kingston, R.I., may be configured with mounting apertures that receive mounting pegs located on a device. Accordingly, in certain embodiments, the PDA 200 may be provided with mounting pegs (not shown), which may be received by mounting apertures (not shown) in a rack, to help secure the PDA 200 to the rack. Additional adapters, which may be located at the top and/or bottom of PDA 200, may further secure the PDA 200.

Turning now to FIG. 8, an embodiment of a housing 204 for the PDA 200 is shown. In the embodiment of FIG. 8, the housing 204 is composed of two substantially U-shaped portions 306, 308. The upper U-shaped portion 306 forms the front face 206 and partially forms the lateral sides 210 of the housing 204. The lower U-shaped portion 308 forms the back face 208 and partially forms the lateral sides 210 of the housing 204.

The lower U-shaped portion 308 and the upper U-shaped portion 306 may be coupled by any suitable means. In the embodiment of FIG. 8, the lower U-shaped portion 308 may slide over and matingly engage the upper U-shaped portion 306. The ends of the upper U-shaped portion 306 may include a flap 320. The ends of the lower U-shaped portion 308 may have flanges 328 that matingly engage the outer portion of flaps 320. The upper U-shaped portion 306 and the lower U-shaped portion 308 may be secured together by inserting fasteners (not shown) through fastener openings 330 in the ends of the upper U-shaped portion 306 and the ends of the lower U-shaped portion 308. The fastener openings 330 may be threaded for receiving matingly threaded fasteners.

The upper U-shaped portion 306 may have access openings 240 formed in both lateral sides 210. The lower U-shaped portion 308 may have access openings 240 formed in one lateral side 210. The upper U-shaped portion 306 and the lower U-shaped portion 308 may be assembled so that the access openings 240 align, thereby providing access to the interior of the PDA 200, such as to the fuse mounts 244 (FIG. 12), on a selected lateral side 210 of the housing 204. That is, during assembly, the lateral side 210 on which the interior of the PDA 200 will be accessible may be determined by aligning the access openings 240 on the appropriate lateral side 210 of the upper U-shaped portion 306 with the access openings 240 on the lower U-shaped portion 308. Of course, the lower U-shaped portion 308 may have access openings 240 on both lateral sides 210, thereby providing access to the interior of the PDA 200 on each lateral side 210.

FIGS. 9-12 show how the various electrical components of the PDA 200 may be assembled within the housing 204. With reference first to FIG. 9, a view of the inside portion of the upper U-shaped portion 306 of the housing 204 is shown. A number of outlet apertures 224 can be seen extending longitudinally along the face of the upper U-shaped portion 306. A number of fuse mounts 340 are also shown, arranged longitudinally along each lateral side 210 of the upper U-shaped portion 306 and extending laterally towards the interior of the upper U-shaped portion 306.

Figure 10:
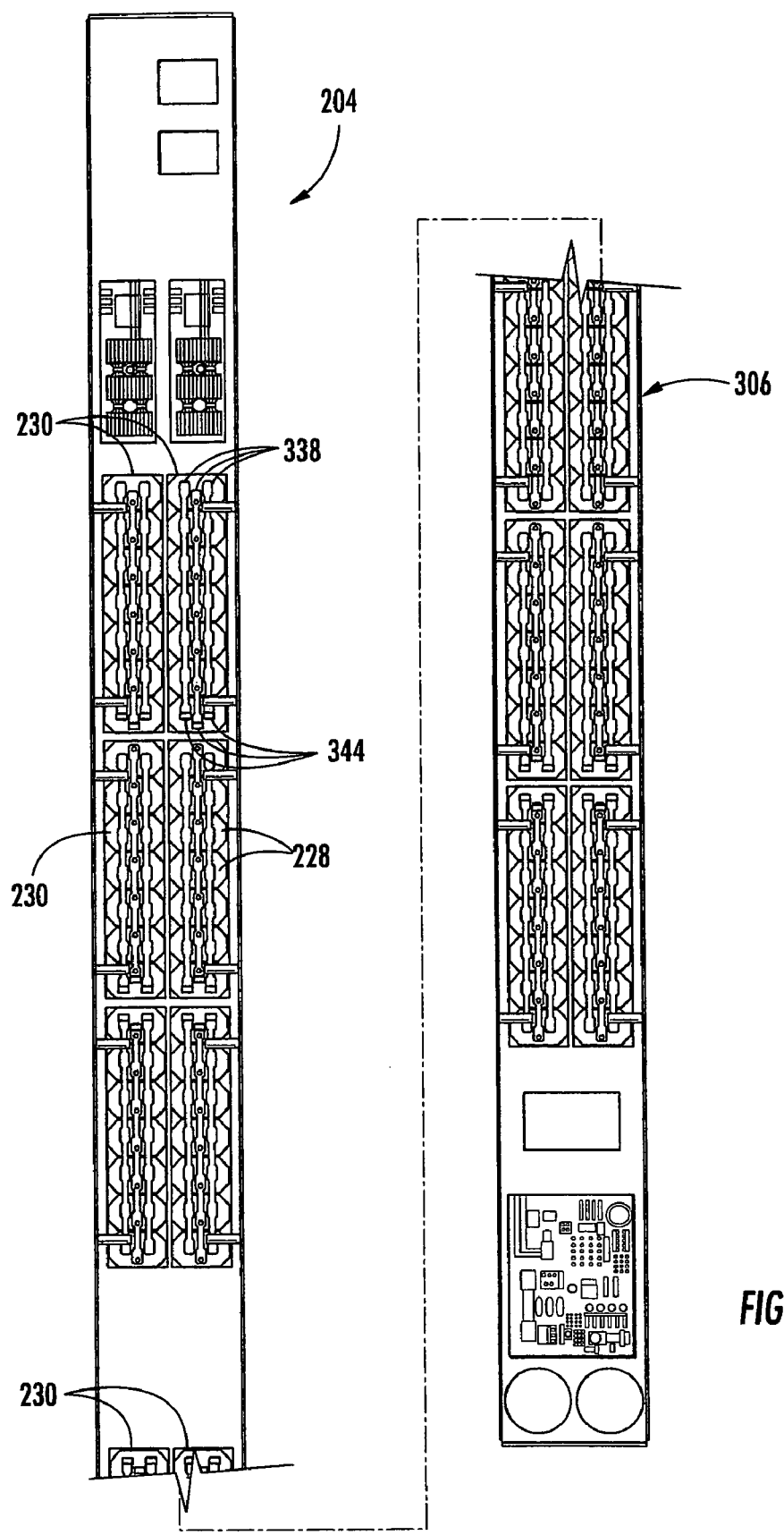
FIG. 10 is a plan view of the inside of the top housing portion of the power distribution apparatus of FIG. 9 illustrating the placement of outlet gangs and other electronic components.

With reference now to FIG. 10, a plurality of linear outlet gangs 230 are shown mounted in the upper U-shaped portion 306, extending through the outlet apertures 224 (FIG. 9). Each outlet gang 230 provides a column of outlets 228. As shown, three generally linear power rails 338 are coupled to, or mounted to, the back of each outlet gang 230. Depending on the application, a larger or lesser number of power rails 338 could be used. Each power rail 338 is mounted to extend along the back side of an outlet gang 230 and connect to each outlet 228 in the outlet gang 230. The power rails 338 may be laterally spaced, being generally co-aligned. In certain embodiments, the power rails 338 are parallel.

In the embodiment of FIG. 10, each power rail 338 is slightly shorter in length than the length of the outlect gang, although in other embodiments that power rails may be of differing lengths, with differing power rail end configurations to accomplish differing objectives. For example, one or more end configurations could instead extend past one end, or both ends, of a ganged outlet, in order to engage an electrical connector or component external of the ganged outlet, such as to another ganged outlet power rail or other structure.

An insulating barrier (not shown), which may be a protrusion, such as a flange or ridge extending transversely outwardly from the back surface of an outlet gang 230, may be used to prevent electrical contact between adjacent power rails 338. In certain embodiments, the power rails 338 may be located internally within the outlet gang 230. Locating the power rails 338 within the outlet gangs 230 may reduce the chance for accidental contact between a power rail 338 and other PDA components (including adjacent power rails 338), as well as reduce the possibility of damage to the power rails 338 or other components.

Each power rail 338 has a protrusion or contact element (not shown) that extends into a particular receptacle (not shown) in each power outlet 228 in an outlet gang 230. Each receptacle receives a prong (not shown) from a power plug (not shown) of an electrical appliance (not shown). The power rails 338 therefore serve to electrically couple each power outlet 228 in an outlet gang 230 to mating electrical connector prongs on power plugs. Each power rail 338 can thereby correspond to a particular electrical power component, such as a line, neutral, or ground connection of AC line power. The power rails 338 are made from a conducting material, such as a conductive metal.

The use of the power rails 338 obviates the need for individually wiring together multiple individual power outlets 228. Although the power rails 338 are shown as parallel, linear rails, other rail configurations could be used. For example, the power rails 338 could be curved in order to accommodate an arcuate pattern of power outlets 228.

As noted above, a power rail 338 may be provided with at least one connecting prong 344. Although the power rails 338 are shown as only having connecting prongs 344 at one end of each power rail 338, in at least certain embodiments, connecting prongs 344 are located at both longitudinal ends of each power rail 338. The connecting prong 344 may be used to place a power rail 338, and therefore a corresponding outlet gang 230, in electrical communication with other electrical components. The connecting prong or terminal 344 may be coupled to other electrical components by any suitable connecting means. In some embodiments, wires may be used as the connecting means. Of course, the present invention is not limited to power rails 338 having connecting prongs 344. Any suitable means may be used for placing the power rails 338 in electrical communication with other electrical components.

Figure 11:
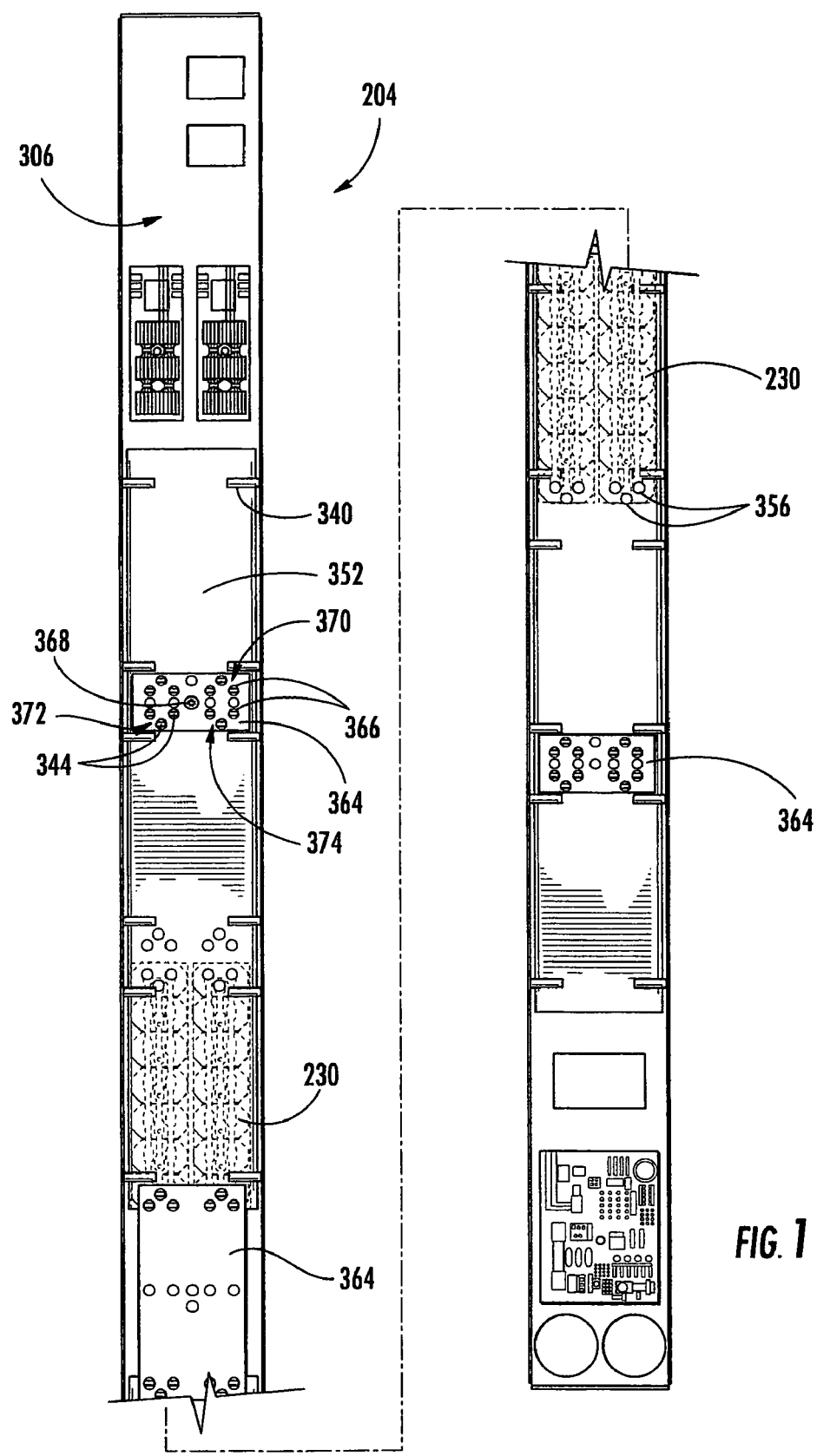
FIG. 11 is a plan view of the inside of the top housing portion of the power distribution apparatus of FIG. 9 illustrating the placement of connection boards and nonconductive material on top of the components shown in FIG. 10.

With reference now to FIG. 11, each outlet gang 230 (two of which are shown in see-through, environmental lines, in FIG. 11), is shown covered by a layer of nonconductive material 352 that extends substantially across the width of upper U-shaped portion 306. More than one piece of the nonconductive material 352 may be used and the nonconductive material 352 may be shaped and sized as desired to insulate the electrical components of the PDA 200. The nonconductive material 352 may be made of any suitable material that substantially does not conduct electricity, such as plastics, rubber, and the like. In at least one embodiment, the nonconductive material 352 is polyester film. The nonconductive material 352 can be used to prevent unintended electrical communication between adjacent electrical components, such as between the outlet gangs 230 and the fuse board 248. For example, the nonconductive material 352 may be placed over the back of the outlet gangs 230 and between the fuse boards 248 (FIG. 12). The nonconductive material 352 may have holes 356 to allow the connecting prongs 344 to pass therethrough.

In a further embodiment, the PDA 200 includes a connector board 364 connected to at least one electrical component. As shown in FIG. 11, the connector board 364 is connected to two electrical components. The connector board 364 is placed between, and used to connect, two outlet gangs 230 (see also FIG. 12). The connector board 364 may be an at least semi-rigid component capable of connecting to, and being in electrical communication with, at least one electrical component or placing at least two electrical components in electrical communication. In further embodiments, the connector board 364 may be in electrical communication with more than two electrical components. In certain embodiments, the connector 364 is a printed circuit board. In at least one embodiment, the connector 364 is a four-layer printed circuit board.

The connector 364 may have a number of holes or passages 366 extending therethrough. The holes 366 may be lined with a conducting material, such as a conductive metal. In at least one embodiment, a connecting prong or terminal 344 of a power rail 338 associated with an outlet gang 230 can engage a hole 366. If desired, the connecting terminal 344 may be further secured to the connector 364, such as by soldering. Nonconductive material 352 may be placed between the connecting prongs or terminals 344 and the connector 364 (see FIG. 12). The connecting prongs 344 may extend through openings (FIG. 12) in the nonconductive material 352.

The connector board 364 may be coupled to the upper U-shaped portion 306 of the housing 204. In one embodiment, the connector board 364 is provided with a fastener passage. A mating fastener 368, such as a screw, may be inserted through a fastener passage and securely received by a mount (not shown) on the upper U-shaped portion 306.

The connector board 364 may be used to transmit electrical signals to or electrically couple electrical parts attached to the connector board 364. In at least one embodiment, connector board 364 is used to transmit components of AC line power to parts attached to opposite ends of the connector board 364. In the case of outlet gangs 230 having connecting terminals 344 at only one end, similar connections between outlet gangs 230 and the connector board 364 may occur at opposite sides at each opposite end of connector board 364, such as between position 370 and position 372. However, if the outlet gangs 230 are provided with connectors 344 at each end, similar connections between the outlet gangs 230 and the connector board 364 may occur at the same side at each opposite end of the connector board 364, such as between position 370 and position 374.

FIG. 12 illustrates the upper U-shaped portion 306 with final fuse and wiring components. Fuse boards 248 are positioned longitudinally along a lateral side 210 of the upper U-shaped portion 306. The fuse boards 248 are substantially coincident with the access windows 240 (not shown in FIG. 12). Each fuse board 248 may be secured to the housing 204 by inserting mating fasteners (not shown), such as screws, through fastener openings (not shown) adjacent an access window 240, through fuse mounts 340, and into fastener mounts 362 on each fuse board 248. The fuse boards 248 may have a plurality of connection terminals 376 for placing the fuses 246 in electrical communication with other components of the PDA 200 (FIG. 2).

A plurality of wires 380 can connect the various components, such as outlet gangs 230 (FIG. 11) and fuse boards 248. The wires 380 may be insulated wires, in order to help prevent unintended electrical contact between the wires 380 and the other components of PDA 200. In addition, wires 380 may be placed on the opposite side of the nonconductive material 352 from the outlet gangs 230 in order to help prevent such unintended contact. The wires 380 are shown as laid out substantially along the side of the upper U-shaped portion 306 opposite the fuse boards 248. Wires 380 may be secured together by fasteners 382, such as locking plastic bands.

Figure 13:
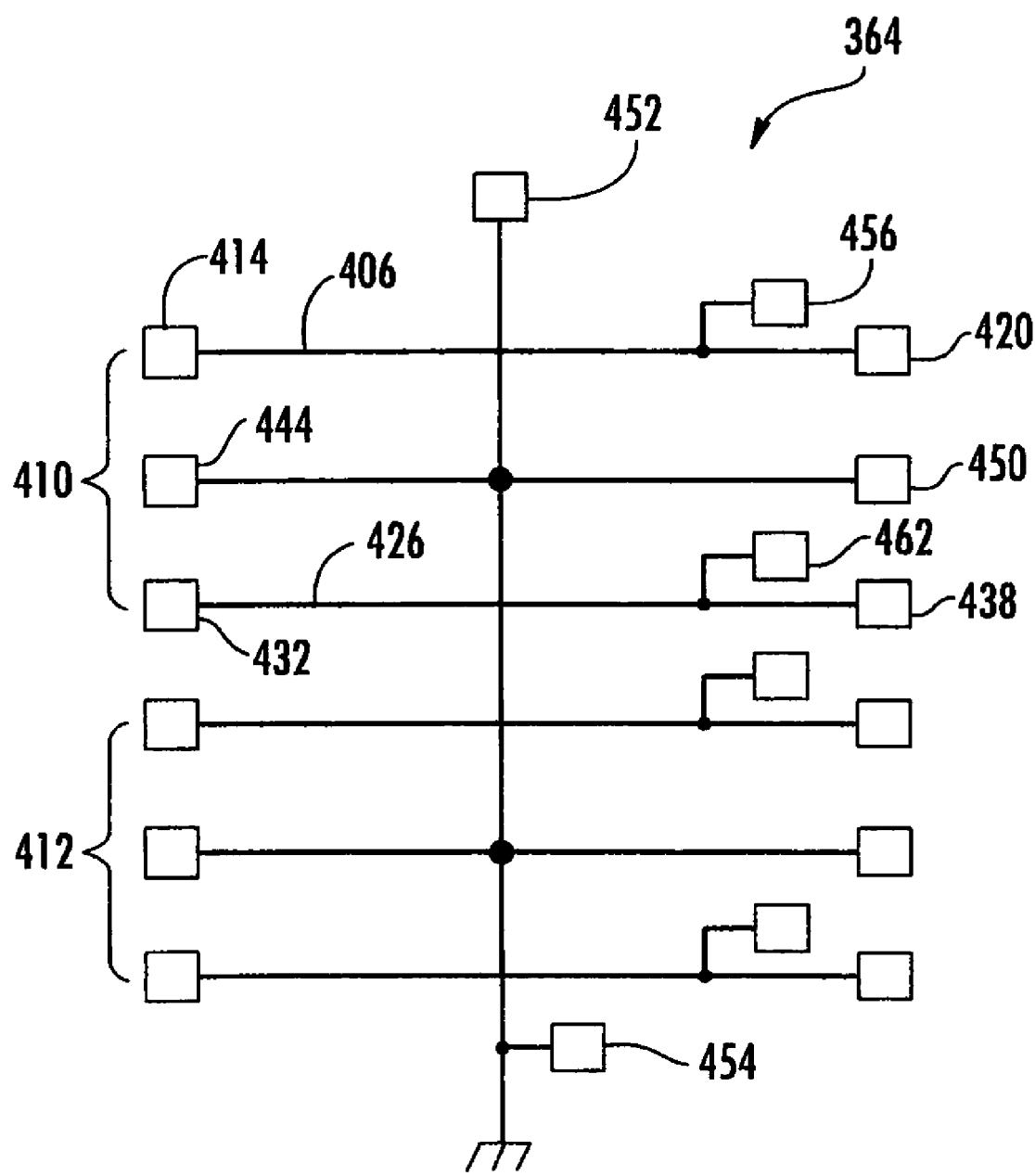
FIG. 13 is a schematic diagram of a connection board that may be used in the power distribution apparatus of FIG. 9.

A schematic diagram of a printed circuit board 364 useable in this embodiment is shown in FIG. 13. Each layer of the printed circuit board 364 may correspond to a single electrical component. For example, when the circuit board 364 is used for power transmission, such as AC line power transmission, one layer may correspond to a line, or "hot", electrical connection, one layer may correspond to a neutral connection, and one layer may be connected to a ground. The use of an entire layer of the printed circuit board 364 for each connection may allow for larger amounts of electricity to flow through the printed circuit board 364.

FIG. 13 shows two power inlets, 410 and 412, connected to circuit board 364 for distributing power to two integral outlet gangs 230. Lead 406 of power inlet 410, which may be an AC line power connection, is shown connected to connection point 414. Connection point 414, as well as other connection points, may be a pad. The pad may be an annular ring surrounding a hole in the circuit board 364. The annular ring may be made from a conducting material, such as a conductive metal.

A power rail 338 (FIG. 10) of a first outlet gang 230 (FIG. 10) may also be connected to pad 414. Pad 414 is in electrical communication with pad 420 through the circuit board 364. In turn, pad 420 may be connected to a power rail 338 of a second outlet gang 230. Similarly, lead 426 of power inlet 410, which may be an AC line power neutral connection, may be connected to pad 432. A power rail 338 of the first outlet gang 230 may also be attached to pad 432. Pad 432 is in electrical communication with pad 438. Pad 438 may be connected to a power rail 338 of the second outlet gang 230. Pads 444 and 450 may be ground connections for their respective outlet gangs 230 and be grounded through pads 452 and 454. Leads 406 and 426 may be connected to a fuse board 248 (FIG. 12) through pads 456 and 462, respectively. Additional outlet gangs 230, other electrical components, or additional power inlets, such as power inlet 412, may be connected in a similar manner.

Figure 14:
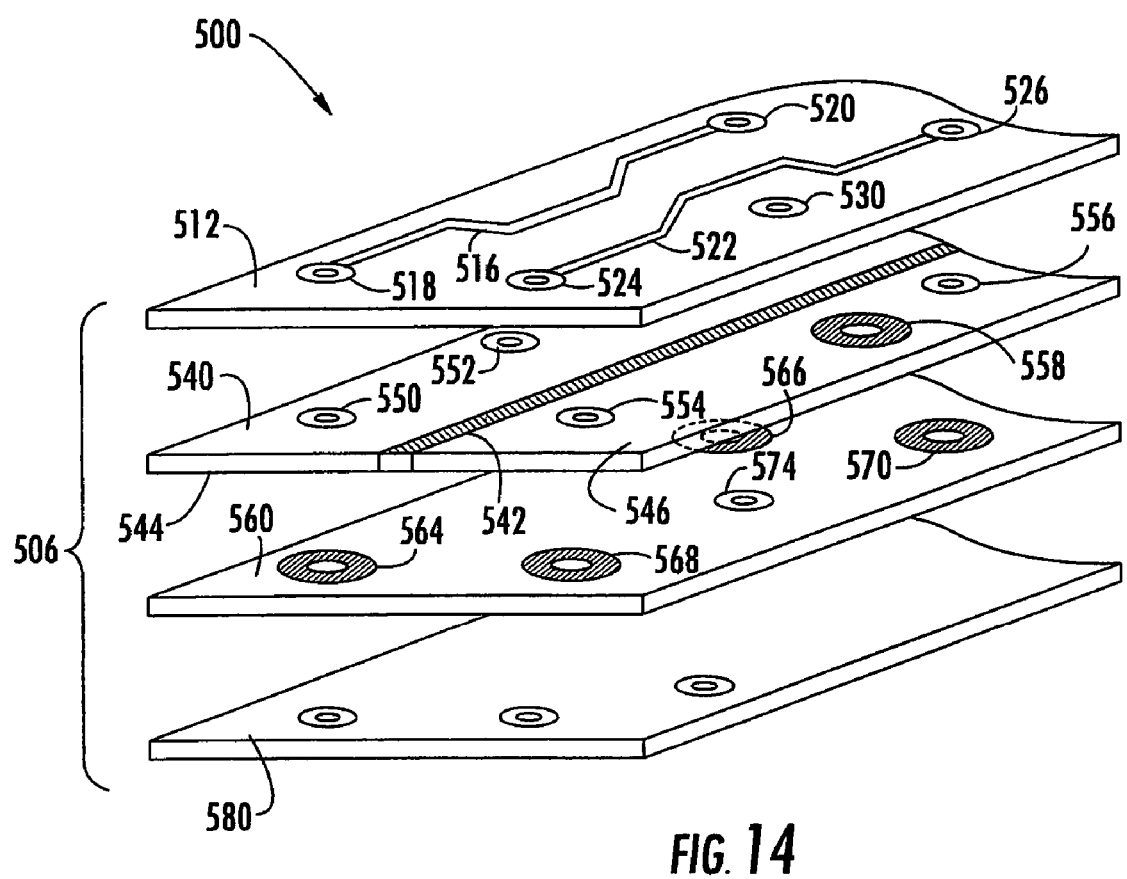
FIG. 14 is a schematic diagram of an embodiment of a connection board having a layer formed into two sublayers with the sublayers insulated from each other.

FIG. 14 depicts an alternate embodiment of a circuit board 500 for use in certain embodiments of the present invention. Circuit board 500 comprises a plurality of layers 506. Each layer 506 may be used to transmit one or more electrical components, such as components of AC line power.

Layer 512 may be a signal layer having a connection 516 between a first connection point 518 and a second connection point 520. The layer 512 may also have a connection 522 between a third connection point 524 and a fourth connection point 526. Connections 516 and 522 serve to transmit electrical signals to, or electrically couple, devices or components attached to connection points 518, 520 and 524, 526, respectively. Additional connection points, such as connection point 530 may also be provided. Although FIG. 14 depicts connections between connection points on the same side of the circuit board 500, connections can be made between connection points at any location of the circuit board 500. For example, a connection could be made between connection point 518 and connection point 526.

Layer 540 is shown as a split plane. The layer 540 may be substantially a solid plane of conducting material, such as copper. However, the layer 540 has an insulating barrier 542 which divides layer 540 into a first side 544 and a second side 546. The insulating barrier 542 may be an area of the layer 540 where the conducting material has been removed, an insulating material or coating placed on or in the layer 540, or any other suitable insulating means. The layer 540 also has connection points 550, 552 and 554, 556 which may be in communication with connection points 518, 520 and 524, 526, respectively.

Each side 544, 546 may carry an electronic component, such as a component of AC line power, which may be the same or different. In at least one embodiment, the first side 544 carries a line component of AC line power and the second side 546 carries a neutral component of AC line power. In this way, power can be conducted through the layer 540 to devices attached to the connection points 518-526. A connector 558 is shown having at least a portion of its conducting material removed, or otherwise being insulated from the connection point 530.

As shown in FIG. 14, layer 560 may be a unified conductive layer, such as a copper layer. However, connectors 564, 566, 568, 570, located on layer 560, have had at least a portion of their conducting material removed, or otherwise are insulated from connection points 518-526 and 550-556. Connection point 574 is in communication with connection point 530. Layer 580 may be another signal layer.

The use of split plane layers may allow for a greater variety of electrical signals and power components to be distributed across a circuit board 500, while allowing circuit boards having a relatively small number of layers to be used. In addition, circuit boards having split plane layers may allow a greater number of connections to be made, a greater variety of connections to be made, and/or a greater number of devices to be connected by, or to, a circuit board 500.

Embodiments of circuit board 500 are not limited to the circuit board 500 shown in FIG. 5. For example, greater or fewer layers could be used, the number and position of signal, solid, and split layers may be varied. In addition, transmission layers may be broken up into more than two sublayers. However, each sublayer is preferably suitably large enough to transmit the desired electrical component. In the case of power transmission, particularly AC power transmission, even more particularly AC-line power, each layer or sublayer is preferably suitably large enough to effectively transmit a component of AC line power.

It can thus be seen that certain embodiments of the present invention provide a PDU having a housing that is configured to be closely mounted to a variety of racks. At least some embodiments provide a PDU having substantially reduced wiring requirements, which may result in faster assembly, more economical construction, smaller size, greater reliability, and easier, safer maintenance or repair of the PDU.

It is to be understood that the above discussion provides a detailed description of preferred embodiments. The above descriptions of the preferred embodiments will enable those skilled in the art to make many departures from the particular examples described above to provide apparatus constructed in accordance with the present invention. The embodiments are illustrative, and not intended to limit the scope of the present invention. The scope of the present invention is rather to be determined by the scope of the claims as issued.

What is claimed is:

1. A power distribution unit connectable to a plurality of electronic apparatus mounted in an associated electronic equipment mounting rack, the power distribution unit comprising, in combination:
   (A) a power distribution unit housing having at least one power outlet gang passage penetrating the power distribution unit housing and including mounting structure mountable to the associate electronic equipment mounting rack;
   (B) a power input penetrating the power distribution unit housing;
   (C) at least one longitudinally aligned, pre-assembled outlet gang mounted in the power distribution unit housing, said outlet gang having at least one circuit rail and a plurality of pre-joined power outlets secured to said at least one circuit rail with power outlet contacts respectively in power supply communication with said at least one circuit rail; and
   (D) a connector coupled to the at least one longitudinally aligned outlet gang and in communication with the power input.

2. The power distribution unit of claim 1 wherein the connector is configured to distribute at least a component of AC line power from the power input to the at least one longitudinally aligned outlet gang, and wherein the plurality of pre-joined power outlets comprises at least four pre-joined power outlets.

3. The power distribution unit of claim 1 said power distribution unit housing further comprising a rack mounting channel laterally penetrating a longitudinal surface of said housing.

4. The power distribution of claim 1, further comprising a power distribution interconnect mounted within said power distribution unit housing intermediate said at least one longitudinally aligned outlet gang and in power supply communication with said power input and with said at least one circuit rail of the at least one longitudinally aligned outlet gang.

5. The power distribution unit of claim 4, further comprising a fuse access passage formed in the power distribution unit housing adjacent, and providing access to, said power distribution interconnect.

6. The power distribution unit of claim 4 wherein the power distribution interconnect comprises a fuse holder within a circuit line comprising the at least one circuit rail of the at least one longitudinally aligned outlet gang.

7. The power distribution unit of claim 4 further comprising a rack mounting channel laterally penetrating a longitudinal surface of said housing, wherein the power distribution housing has a front side opposing a back side, said at least one power outlet passage penetrating the front side and said rack mounting channel comprises a contour in the back side extending toward said front side, and said power distribution interconnect is intermediate the front side and contour.

8. The power distribution unit of claim 1 wherein the at least one circuit rail comprises at least a first circuit rail, and wherein the at least one longitudinally aligned outlet gang further comprises at least a second circuit rail secured to said plurality of power outlets, and wherein the plurality of pre-joined power outlets comprises at least four pre-joined power outlets.

9. The power distribution unit of claim 8 wherein the second circuit rail is at least substantially parallel to the first circuit rail.

10. The power distribution unit of claim 1 further comprising an electronic component connected to the connector.

11. The power distribution unit of claim 10 wherein the at least one longitudinally aligned outlet gang is at least a first longitudinally aligned outlet gang, and wherein the electronic component comprises at least a second outlet gang having at least one circuit rail.

12. The power distribution unit of claim 11 further comprising an electronic equipment rack mounting channel laterally penetrating a longitudinal surface of said housing, and wherein said power distribution housing has a front side opposing a back side, said at least one power outlet passage penetrating said front side and said rack mounting channel comprises a contour in said back side extending toward said front side, and said power distribution interconnect is intermediate said first and second outlet gangs.

13. A power distribution apparatus connectable to a plurality of electronic apparatus mounted in an electronic equipment rack, the power distribution apparatus comprising:
   (A) a power distribution apparatus housing having mounting structure for mounting in association with the electronic equipment rack and comprising at least one power outlet gang aperture in the power distribution unit housing;
   (B) a power input penetrating to the power distribution apparatus housing;
   (C) at least first and second integral outlet gangs mounted in the at least one power outlet gang aperture in the power distribution apparatus housing, the first and second integral outlet gangs each comprising:
      i. a plurality of conjoined power outlets each having a connection side and back side and extending through the at least one power outlet aperture;
      ii. at least one circuit rail secured to the back side of each of the plurality of conjoined power outlets and placing each of the conjoined power outlets in electrical communication with the at least one power input;
   (D) an outlet gang interconnect disposed between the at least first and second outlet gangs and connected to said circuit rails of the at least first and second outlet gangs.

14. The power distribution apparatus of claim 13 wherein the outlet gang interconnect distributes components of AC line power to the at least a first circuit rail of the at least first and second outlet gangs.

15. The power distribution apparatus of claim 13 further comprising a nonconductive material at least substantially covering said circuit rails of the at least first and second outlet gangs.

16. The power distribution apparatus of claim 13, wherein the power distribution apparatus housing defines an electronic equipment rack mounting channel having a first width, at least a portion of the power distribution housing having a second width, the first width being substantially less than the second width.

17. The power distribution apparatus of claim 13, wherein the power distribution apparatus housing is generally a rectangular box shape and comprises a front panel, a back panel, and two lateral panels, the power distribution apparatus housing comprising an electronic equipment rack mounting section comprising a recess laterally spanning the back panel, the recess adapted to fit over a protrusion in an associated electronic equipment rack to which the power distribution apparatus housing is mountable.

18. The power distribution apparatus of claim 17 wherein the outlet gang interconnect is mounted in a section of the power distribution apparatus housing adjacent to the channel.

19. The power distribution apparatus of claim 13 further comprising a fuse access opening formed in the power distribution apparatus housing.

20. The power distribution apparatus of claim 19 further comprising a fuse assembly mounted at least partially within the power distribution apparatus housing, wherein the fuse access opening allows access to at least a portion of the fuse assembly.

21. The power distribution apparatus of claim 19, the power distribution apparatus housing comprising a plurality of sides, wherein the at least one power outlet gang aperture is formed in a first side of the power distribution apparatus housing and the fuse access opening is formed in a second side of the power distribution apparatus housing.

22. The power distribution apparatus of claim 21, wherein the first side is adjacent the second side.

23. The power distribution apparatus of claim 19 further comprising a fuse assembly positioned substantially adjacent to at least one of the at least first and second outlet gangs.

24. The power distribution apparatus of claim 23 further comprising a nonconductive material disposed between at least a portion of the fuse assembly and the at least one of the at least first and second outlet gangs.

25. The power distribution apparatus of claim 13, the at least a first circuit rail of the at least first and second outlet gangs each comprising a connection terminal at a first end of the respective outlet gang, and wherein the first and second outlet gangs each comprise at least four power outlets.

26. The power distribution apparatus of claim 25, wherein the at least first and second outlet gangs are mounted in the power distribution apparatus housing with the connection terminals of the first outlet gang of the at least first and second outlet gangs proximate the connection terminals of the second outlet gang of the at least first and second outlet gangs.

27. The power distribution apparatus of claim 25, wherein the first end of the first outlet gang is directed towards the first end of the second outlet gang.

28. The power distribution apparatus of claim 13, the outlet gang interconnect comprising a board comprising a plurality of power supply contacts.

29. The power distribution apparatus of claim 28, wherein the board comprises a printed circuit board.

30. The power distribution apparatus of claim 29, wherein the printed circuit board comprises a plurality of layers, at least a portion of the plurality of layers transmitting a single electrical component of AC line power.

31. The power distribution apparatus of claim 30, wherein at least one of the plurality of layers corresponds to an AC line power connection and at least one of the plurality of layers corresponds to an AC neutral power connection.

32. The power distribution apparatus of claim 29, the printed circuit board comprising at least one layer comprising at least two sublayers, the at least two sublayers being separated by an insulating barrier.

33. The power distribution apparatus of claim 32, wherein each of the at least two sublayers transmits a different electronic component.

34. The power distribution apparatus of 32, wherein one sublayer transmits an AC line component and the other sublayer transmits an AC neutral component.

35. The power distribution apparatus of claim 32 wherein the at least two sublayers effect AC power transmission and the printed circuit board further comprises at least a second layer configured to conduct an electrical signal representing data.

36. The power distribution unit of claim 13, the first and second outlet gangs further comprising at least a second circuit rail secured to the back side of each of the plurality of conjoined power outlets.

37. The power distribution unit of claim 36, wherein the at least a first circuit rail is at least substantially parallel to the at least a second circuit rail.

* * * * *